United States Patent
Leuschner

(10) Patent No.: US 7,660,151 B2
(45) Date of Patent: Feb. 9, 2010

(54) METHOD FOR PROGRAMMING AN INTEGRATED CIRCUIT, METHOD FOR PROGRAMMING A PLURALITY OF CELLS, INTEGRATED CIRCUIT, CELL ARRANGEMENT

(75) Inventor: Rainer Leuschner, Regensburg (DE)

(73) Assignees: Qimonda AG, Munich (DE); Altis Semiconductor, SNC, Corbeil Essonnes Cedex (FR)

( * ) Notice: Subject to any disclaimer, the term of this patent is extended or adjusted under 35 U.S.C. 154(b) by 247 days.

(21) Appl. No.: 11/856,665

(22) Filed: Sep. 17, 2007

(65) Prior Publication Data

US 2009/0073750 A1    Mar. 19, 2009

(51) Int. Cl.
    *G11C 11/00*    (2006.01)
(52) U.S. Cl. ................ 365/158; 365/189.16
(58) Field of Classification Search .......... 365/158, 365/189.16
    See application file for complete search history.

(56) References Cited

U.S. PATENT DOCUMENTS

| | | | |
|---|---|---|---|
| 7,139,465 B2 * | 11/2006 | Gongwer et al. ........ | 365/185.12 |
| 7,280,396 B2 * | 10/2007 | Li et al. .................. | 365/185.03 |
| 2008/0137416 A1 * | 6/2008 | Lee ........................ | 365/185.03 |
| 2008/0316816 A1 * | 12/2008 | Lin ......................... | 365/185.03 |
| 2009/0213654 A1 * | 8/2009 | Perlmutter et al. ..... | 365/185.03 |

* cited by examiner

*Primary Examiner*—Tuan T. Nguyen
(74) *Attorney, Agent, or Firm*—Slater & Matsil, L.L.P.

(57) ABSTRACT

Embodiment of the invention provide a method for programming an integrated circuit, methods for programming a plurality of cells, an integrated circuit, and a cell arrangement. An embodiment of the invention provides a method for programming an integrated circuit having a plurality of cells. The method includes grouping the plurality of cells into a first group of cells and a second group of cells depending on the cell state the cells should be programmed with. The first group of cells and the second group of cells each having a plurality of cells. The method further includes concurrently programming the cells of the first group of cells with a first cell state. After having programmed the cells of the first group of cells, the cells of the second group of cells are concurrently programmed with a second cell state, which is different from the first cell state.

24 Claims, 9 Drawing Sheets

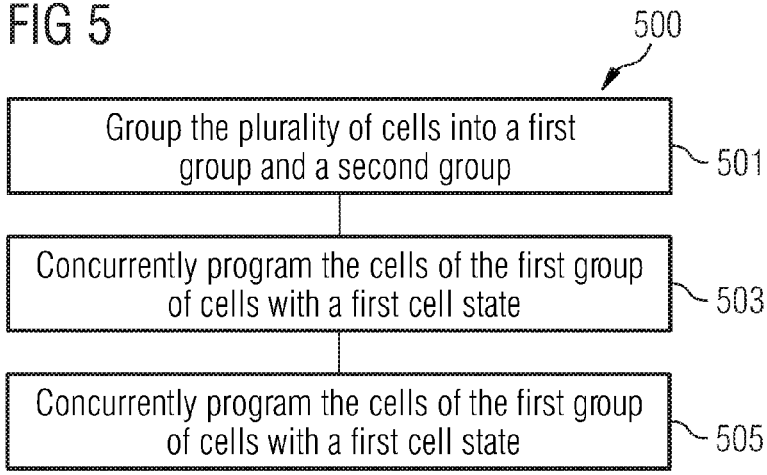
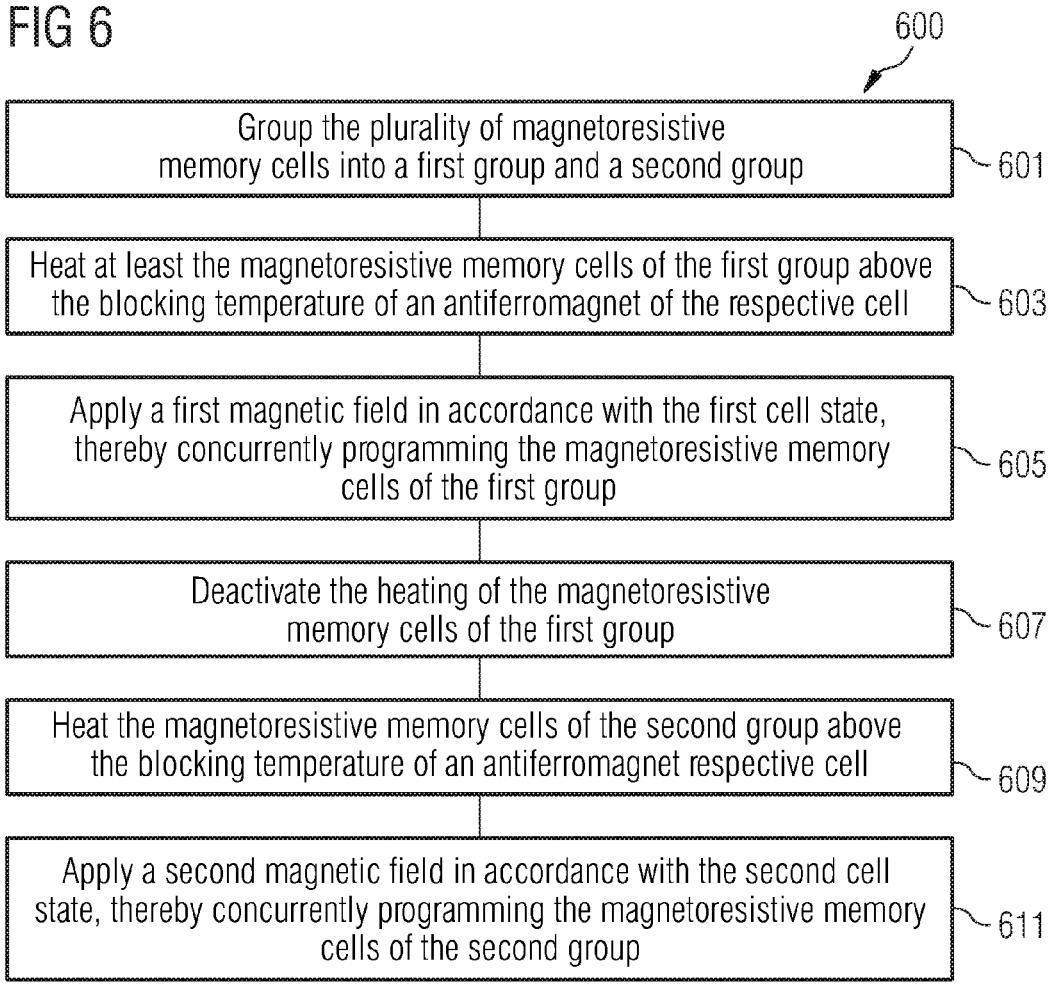

— BL transistor (R0) ~ 701      — 2nd BL transistor (R0) ~ 705
----- BL transistor (R1) ~ 702   ------- 2nd BL transistor (R1) ~ 706
--- sensing of cell state ~ 704  ====== cell selection transistor (WL) ~ 703

— BL transistor (R0) ~ 753
----- BL transistor (R1) ~ 754   ------- Field WL transistors ~ 752
--- sensing of cell state ~ 751  ====== cell selection transistor (WL) ~ 755

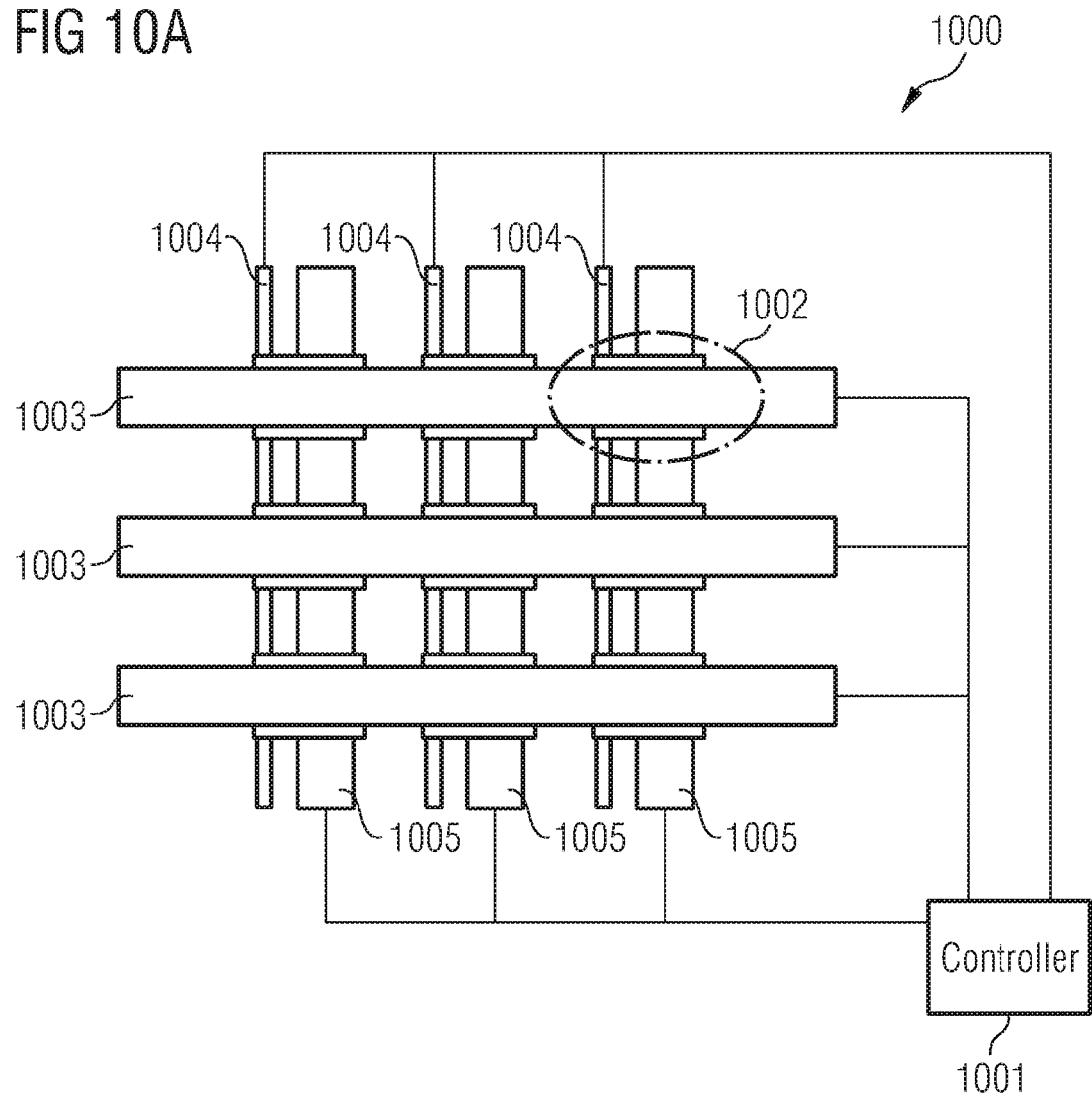

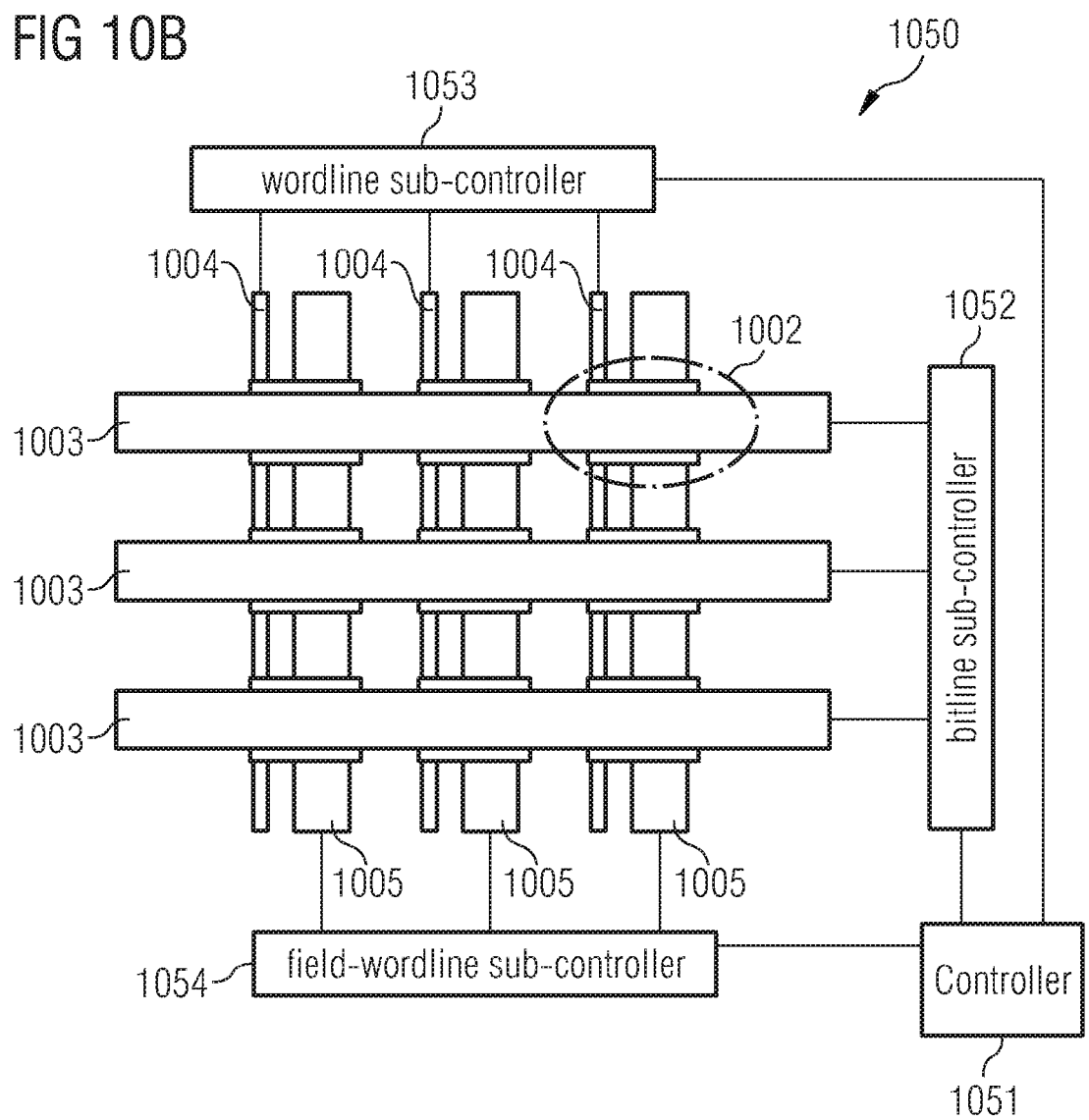

METHOD FOR PROGRAMMING AN INTEGRATED CIRCUIT, METHOD FOR PROGRAMMING A PLURALITY OF CELLS, INTEGRATED CIRCUIT, CELL ARRANGEMENT

TECHNICAL FIELD

Embodiments of the invention relate to a method for programming an integrated circuit, to methods for programming a plurality of cells, to an integrated circuit and to a cell arrangement.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 5 shows a flowchart of the programming of an integrated circuit having a plurality of cells according to one embodiment of the invention;

FIG. 6 shows a flowchart of programming a plurality of magnetoresistive memory cells according to another embodiment of the invention;

FIGS. 10A and 10B show an integrated circuit according to the embodiments of the invention.

DETAILED DESCRIPTION OF ILLUSTRATIVE EMBODIMENTS

Figure 1:
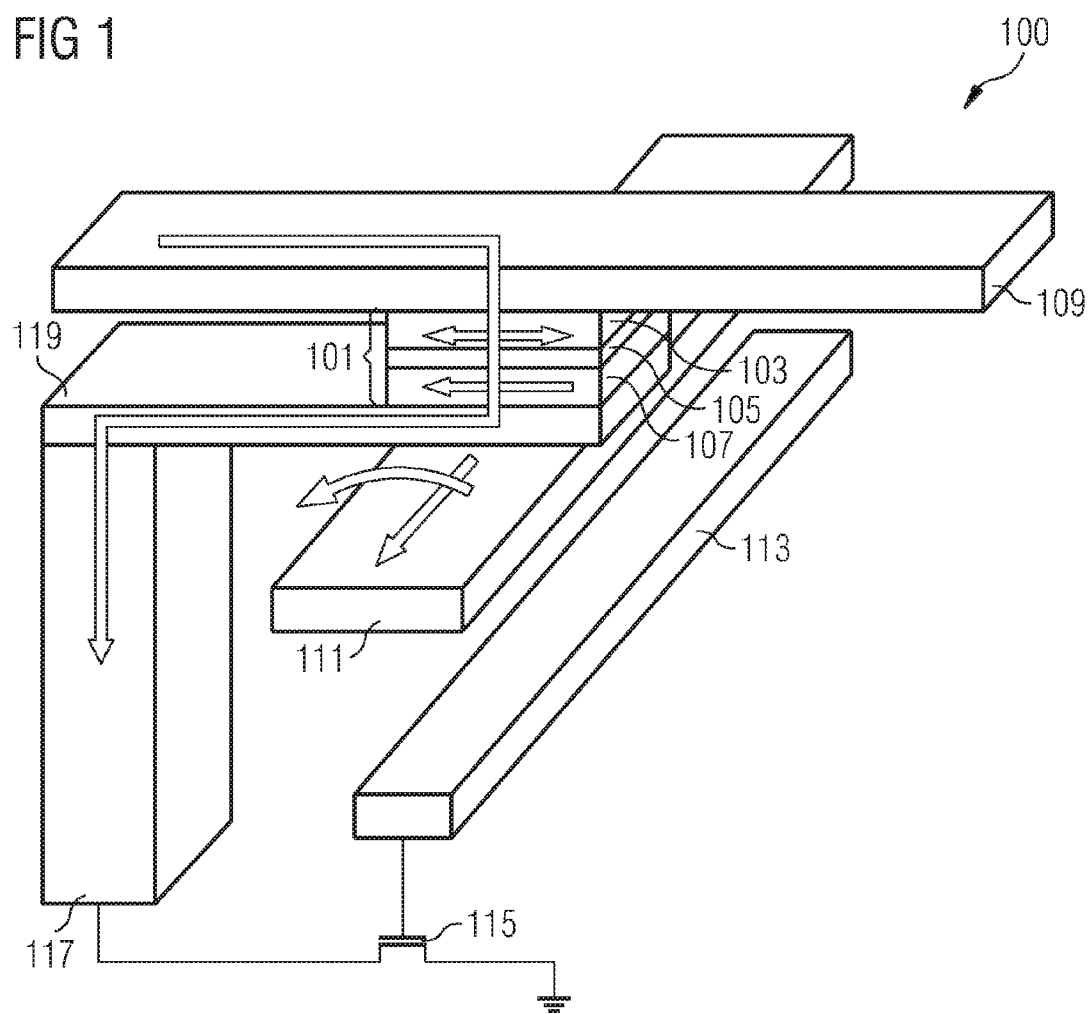
FIG. 1 shows the schematic layout of a magnetoresistive memory cell in an embodiment of the present invention.

Recent developments in spin electronics have enabled the emergence of a new class of non-volatile memories, magnetic random access memories (MRAM). In general, MRAM exploits the electromagnetic properties of magnetoresistive materials to set and maintain information stored within individual magnetic memory cells, also called magnetic tunnel junctions (MTJ). More specifically, digital information is stored within a magnetic memory cell as a bit, the state of which is indicated by the direction of magnetization within one magnetic layer of the memory cell relative to another magnetic layer of the memory cell. A typical magnetic memory cell may have two magnetic layers sandwiching a tunnel barrier layer. One magnetic layer has a fixed magnetic orientation, which may be referred to as the pinned magnetic layer or the reference layer. The reference layer serves as a reference for another magnetic layer within the cell. The other magnetic layer, also referred to as a free magnetic layer or storage layer, can be adapted to change its magnetic orientation relative to the reference layer such that logic states of a bit may be stored within the magnetic tunnel junction.

Typically, an MRAM device includes a plurality of conductive lines which are used to generate magnetic fields. An array of memory cells may be constructed by placing the conductive lines in a matrix structure having rows and columns, with the magnetic memory cells being placed at the intersection of the conductive lines. The conductive lines are referred to as bit lines (BL) and word lines (WL).

A so-called thermal select concept has been proposed which is capable of programming only the selected heated memory cells with lower power consumption, compared to a traditional MRAM programming scheme with a half-select problem or a high power consumption problem. Generally, the MTJ used in the cell is adapted for the thermally assisted switching, wherein the storage layer includes an antiferromagnetic layer with a low blocking temperature. By way of example, the antiferromagnetic materials of the storage layer and the reference layer are chosen to have large difference in their respective blocking temperature. When the MTJ is heated to a temperature exceeding the lower blocking temperature, the antiferromagnetic layer of the storage layer is freed such that the magnetization of the storage layer can be easily switched under the application of a small magnetic field.

In thermally assisted switching of an MRAM device, bit lines provide and deliver heating current to the MTJs to be programmed. Furthermore, bit lines may provide field generating current to the MTJs for switching of the magnetization, which is called "Field by BL" modus. This mode is used to adopt a simple cell layout. However, the effective write time will be only about 1 ns due to rapid cooling of the MTJ. A magnetic field with a high amplitude well above the necessary switching field Hc would be necessary in order to guarantee reliable switching. Furthermore, it is difficult to make a current reducing ferromagnetic liner (FML) for the bit line. As a result, the power consumption per cycle (16 bit) for the "Field by BL" mode is high, which is about 16×I(heat)+16×I(field).

An alternative mode is to use an additional word line to provide the field generating current, which is called "Field by WL" mode. The additional word line is thus referred as field-word line (WL-FLD), as shown in FIG. 1. In this mode, the bit line provides the top contact for heating and the field-word line provides the current for field switching. This usually requires sensing of the cell state before field switching, since the switching is carried out in two processes for each direction separately which requires fast cooling rate. The writing time is thus longer than in the "Field by BL" mode. But the power consumption per cycle (16 bit) is lowered to 16×I(heat)+2×I(field) since the WL-FLD creates the magnetic field for all MTJs on the same WL-FLD. Furthermore, the effective write time may be increased such that reduced fields are allowed. A ferromagnetic liner (FML) can be implemented easily, which helps to reduce the field generating current.

In one embodiment of the invention, the first group of cells includes the cells which should be programmed with a first logic state "0", and the second group of cells includes the cells which should be programmed with a second logic state "1", or vice versa.

The plurality of cells included in the integrated circuit may be memory cells. The memory cells can be magnetoresistive memory cells according to embodiments of the present invention. In other embodiments, the memory cells can also be other types of memory cells, such as PCRAM (Phase Change RAM) and FeRAM (Ferroelectric RAM).

According to another embodiment of the invention, the method for programming the integrated circuit further includes determining the cell state of at least some of the cells, which can be part of the cells selected according to a predetermined condition or can be all of the cells in the integrated circuit. Those cells, whose determined cell state corresponds to the cell state the respective cell should be programmed with, are then determined and grouped into a third group of cells. In one embodiment, the cells of the third group of cells are not programmed. This would improve the efficiency of the programming and would also save power consumption.

In one embodiment of the invention wherein the memory cells are magnetoresistive memory cells, an antiferromagnet may be magnetically coupled to a storage layer of the respective magnetoresistive memory cell. The antiferromagnet may include one or more antiferromagnetic material(s) with a blocking temperature. According to an embodiment of the invention, the programming of the magnetoresistive memory cells of the first group of magnetoresistive memory cells with the first cell state includes heating at least the magnetoresistive memory cells of the first group of magnetoresistive memory cells above the blocking temperature of the antiferromagnet. This is because that the antiferromagnet on the storage layer of the magnetoresistive memory cells would lose its pinning function such that the magnetization orientation of the storage layer can be switched. The heating may be performed on the magnetoresistive memory cells of the first group of magnetoresistive memory cells. In other embodiments, the heating may also be performed on the magnetoresisitive memory cells of both the first and the second groups of magnetoresistive memory cells, or may be performed on all the magnetoresistive memory cells of the integrated cells.

The heating may be carried out by providing electrical heating current through the magnetoresistive memory cells of the first group of magnetoresistive memory cells. The electrical heating current may be provided to each magnetoresistive memory cell via a respective line, with which the respective magnetoresistive memory cell of the first group of magnetoresistive memory cells is coupled. In one embodiment, the respective line is one of a plurality of bit lines coupled to the magnetoresistive memory cells of the integrated circuit.

In one embodiment, the programming of the magnetoresistive memory cells of the first group of magnetoresistive memory cells may further include applying a magnetic field at least to the magnetoresistive memory cells of the first group of magnetoresistive memory cells in accordance with the first cell state. For example, if the first cell state is a logic "0", the magnetic field with a particular direction may be applied such that the magnetic polarity of the storage layer of the magnetoresistive memory cells is oriented to be parallel to the magnetic polarity of the reference layer of the respective magnetoresistive memory cell. The magnetic field may be provided to each magnetoresistive memory cell using a magnetic field generating line. In one embodiment, the magnetic field generating line is referred to as a field-word line (WL-FLD) coupled at least to the magnetoresistive memory cells of the first group of magnetoresistive memory cells, which is e.g. arranged perpendicular to the lines through which the electrical heating current is provided.

According to a further embodiment of the invention, the programming of the magnetoresistive memory cells of the second group of magnetoresistive memory cells may include heating at least the magnetoresistive memory cells of the second group of magnetoresistive memory cells above the blocking temperature of an antiferromagnet being magnetically coupled to a storage layer of the respective magnetoresistive memory cell. Similarly, the heating of the antiferromagnet above the blocking temperature would cause the antiferromagnet to lose the pinning function and thus make the programming of the storage layer possible. The heating may be carried out by providing electrical heating current through the magnetoresistive memory cells of the second group of magnetoresistive memory cells. In an embodiment, the electrical heating current is provided to each magnetoresistive memory cell via a respective line, with which the respective magnetoresistive memory cell of the second group of magnetoresistive memory cells is coupled. The respective line may be the bit line which is coupled to the respective magnetoresistive memory cell, or may be the word line which is coupled to the respective magnetoresistive memory cell.

In a further embodiment of the invention, the programming of the cells of the first group of cells with the first cell state and the programming of the cells of the second group of cells with the second cell state includes activating of cells being coupled to one common activation line. In one embodiment, the common activation line is a word line, wherein a current flowing through the word line would activate cells coupled to the word line.

After having programmed the magnetoresistive memory cells of the first group of magnetoresistive memory cells, the heating current through the magnetoresistive memory cells of the first group of magnetoresistive memory cells may be deactivated. Thus, the antiferromagnet above the storage layer of the magnetoresistive memory cells functions as a pinning layer. In another embodiment, the heating current through the magnetoresistive memory cells of the second group of magnetoresistive memory cells may also be deactivated after the programming thereof.

An embodiment of the invention further relates to a method for programming a plurality of cells. The method includes grouping the plurality of cells into a first group of cells and a second group of cells depending on the cell state the cells should be programmed with, wherein the first group of cells and the second group of cells each includes a plurality of cells. The cells of the first group of cells are then concurrently programmed with a first cell state. After having programmed the cells of the first group of cells, the cells of the second group of cells are concurrently programmed with a second cell state, which is different from the first cell state.

Another embodiment of the invention relates to a method for programming a plurality of cells. The method includes grouping a plurality of magnetoresistive memory cells into a first group of magnetoresistive memory cells and a second group of magnetoresistive memory cells depending on the cell state the magnetoresistive memory cells should be programmed with. The plurality of magnetoresistive memory cells are connected to one common activation line, and the first group of magnetoresistive memory cells and the second group of magnetoresistive memory cells each includes a plurality of magnetoresistive memory cells. At least the magnetoresistive memory cells of the first group of magnetoresistive memory cells are heated above the blocking temperature of an antiferromagnet being magnetically coupled to a storage layer of the respective magnetoresistive memory cell, and a magnetic field is applied to the magnetoresistive memory cells of the first group of magnetoresistive memory cells in accordance with the first cell state, thereby concurrently programming the magnetoresistive memory cells of the first group of magnetoresistive memory cells with the first cell state. After having programmed the cells of the first group of cells, the heating current through the magnetoresistive memory cells of the first group of magnetoresistive memory cells is deactivated. The magnetoresistive memory cells of the second group of magnetoresistive memory cells are then heated above the blocking temperature of an antiferromagnet being magnetically coupled to a storage layer of the respective magnetoresistive memory cell, and a magnetic field is applied to the magnetoresistive memory cells of the second group of magnetoresistive memory cells in accordance with the second cell state, thereby concurrently programming the magnetoresistive memory cells of the second group of magnetoresistive memory cells with the second cell state.

Another embodiment of the invention further relates to an integrated circuit having a plurality of cells and a controller programming the plurality of cells. The controller is configured to group the plurality of cells into a first group of cells and a second group of cells depending on the cell state the cells should be programmed with, such that the first group of cells and the second group of cells each has a plurality of cells. The controller is further configured to concurrently programming the cells of the first group of cells with a first cell state; and concurrently programming the cells of the second group of cells with a second cell state after having programmed the cells of the first group of cells. The second cell state is different from the first cell state.

In one embodiment, the cells included in the integrated circuit are memory cells. The memory cells can be magnetoresistive memory cells, or can be any other types of memory cells, such as DRAM (Dynamic RAM), SRAM (Static RAM) and FeRAM (Ferroelectric RAM). In one embodiment, the magnetoresistive memory cells are magnetic tunnel junction (MTJs) cells including a soft magnetic layer, a tunnel layer and a reference magnetic layer. The soft magnetic layer and the reference magnetic layer may be made from magnetic materials, examples of which includes but are not limited to nickel iron, nickel iron cobalt, cobalt iron, cobalt zirconium niobium, cobalt iron boron and alloys of these materials. Other magnetic materials used in the MRAM fabrication industry may also be used for the soft magnetic layer and the reference magnetic layer. It is noted that the soft magnetic layer and the reference magnetic layer each may include multiple layers of materials. The tunnel layer may be made from dielectric materials, such as Silicon Oxide ($SiO_2$), Magnesium Oxide (MgO), Silicon Nitride ($SiN_2$), Aluminum Oxide ($Al_2O_3$), Aluminum Nitride (AlNx) and Tantalum Oxide (TaOx), or can be made from non-magnetic materials, such as Copper, Gold and Silver.

According to an embodiment of the invention, a first antiferromagnetic layer may be coupled to the soft magnetic layer of the magnetoresistive memory cells as a pinning layer, which has a first blocking temperature. A second antiferromagnetic layer may be coupled to the reference magnetic layer of the magnetoresistive memory cells as a pinning layer, which has a second blocking temperature. The two antiferromagnetic layers may be made from different antiferromagnetic materials such that the first blocking temperature is much lower than the second blocking temperature. Furthermore, the material for the first antiferromagnetic layer may be selected such that the first blocking temperature is in a suitable range in consideration of the operation temperature range of the magnetoresistive memory cells. Examples of the antiferromagnetic materials for the first antiferromagnetic layer includes alloys of iridium-manganese and iron-manganese. Examples of the antiferromagnetic materials for the second antiferromagnetic layer may include alloys of platinum-manganese, nickel-manganese, osmium-manganese, platinum-palladium-manganese and platinum-manganese-chromium. In general, the blocking temperature for an antiferromagnetic layer increases with the thickness of the layer. Accordingly, it may be provided for the second antiferromagnetic layer to have a relatively larger thickness than the first antiferromagnetic layer.

According to another embodiment of the invention, the controller included in the integrated circuit may have a microcontroller, a plurality of controllers, or may include a plurality of logic gates operating together to control the programming of the plurality of the cells in the integrated circuit. In an embodiment where the magnetoresistive memory cells of the integrated circuit are coupled with bit lines which are arranged perpendicular to word lines and field-word lines, the controller may control electrical current flowing through the respective lines, thereby controlling the programming of the respective magnetoresistive memory cells.

In one embodiment, the controller may be configured to determine the cell state of at least some of the cells. For example, the controller may generate control signals controlling electrical current through the bit lines and the word lines to determine the resistance of the respective cells, such that the cell state of the cells are determined. The controller may then determine those cells, the cell state of which corresponds to the cell state the respective cell should be programmed with. For instance, those cells with a logic "0" which should be programmed to be "0" and those cells with a logic "1" which should be programmed to be "1" are determined. Those determined cells are grouped into a third group of cells. The controller may be further configured not to program the cells of the third group of cells, since they are already in the desired state.

In another embodiment, when programming the magnetoresistive memory cells of the first group of magnetoresistive memory cells with the first cell state, the controller is further configured to generate a heat control signal controlling heating at least the magnetoresistive memory cells of the first group of magnetoresistive memory cells above the blocking temperature of an antiferromagnet being magnetically coupled to a storage layer of the respective magnetoresistive memory cell. In a further embodiment, the controller is configured to control heating by controlling electrical heating current flowing through the magnetoresistive memory cells of the first group of magnetoresistive memory cells. The above embodiments for controlling the programming of the magnetoresistive memory cells of the first group of magnetoresistive memory cells are analogously valid for controlling the programming of the magnetoresistive memory cells of the second group of magnetoresistive memory cells.

In accordance with one embodiment, the integrated circuit may include a plurality of heating lines, wherein each cell of the integrated circuit is coupled with one heating line of the plurality of heating lines. The integrated circuit may further include a magnetic field generating line generating a magnetic field for programming the plurality of cells. In a further embodiment, the integrated circuit may include a common activation line, wherein at least some of the cells is coupled with the common activation line. In an embodiment of the invention, the plurality of heating lines, the magnetic field generating line and the common activation line refer to the bit lines, the field-word line and the word line, respectively. Furthermore, the integrated circuit may include a plurality of the magnetic field generating lines and a plurality of common activation lines.

The controller of the integrated circuit may be further configured to deactivate the heating current through the magnetoresistive memory cells of the first group of magnetoresistive memory cells, after having programmed the magnetoresistive memory cells of the first group of magnetoresistive memory cells. Analogously, the controller of the integrated circuit may also be configured to deactivate the heating current through the magnetoresistive memory cells of the second group of magnetoresistive memory cells, after having programmed the magnetoresistive memory cells of the second group of magnetoresistive memory cells.

Another embodiment of the invention further relates to a cell arrangement including a plurality of magnetoresistive memory cells and a controller programming the plurality of cells. The controller is configured to group a plurality of magnetoresistive memory cells, which are connected to one common activation line, into a first group of magnetoresistive memory cells and a second group of magnetoresistive memory cells, depending on the cell state the magnetoresistive memory cells should be programmed with. The first group of magnetoresistive memory cells and the second group of magnetoresistive memory cells each include a plurality of magnetoresistive memory cells. The controller is further configured to heat at least the magnetoresistive memory cells of the first group of magnetoresistive memory cells above the blocking temperature of an antiferromagnet being magnetically coupled to a storage layer of the respective magnetoresistive memory cell and to apply a magnetic field to the magnetoresistive memory cells of the first group of magnetoresistive memory cells in accordance with the first cell state. Thus, the magnetoresistive memory cells of the first group of magnetoresistive memory cells with the first cell state are concurrently programmed. After having programmed the cells of the first group of cells, the controller is configured to deactivate the heating current through the magnetoresistive memory cells of the first group of magnetoresistive memory cells. Then, the controller is configured to heat the magnetoresistive memory cells of the second group of magnetoresistive memory cells above the blocking temperature of an antiferromagnet being magnetically coupled to a storage layer of the respective magnetoresistive memory cell and to apply a magnetic field to the magnetoresistive memory cells of the second group of magnetoresistive memory cells in accordance with the second cell state, thereby concurrently programming the magnetoresistive memory cells of the second group of magnetoresistive memory cells with the second cell state.

A further embodiment of the invention relates to an integrated circuit means having a plurality of cell means and a control means for programming the plurality of cell means. The control means is configured to group a plurality of cells into a first group of cells and a second group of cells depending on the cell state the cells should be programmed with, wherein the first group of cells and the second group of cells each has a plurality of cells. The control means is further configured to concurrently programming the cells of the first group of cells with a first cell state; and concurrently programming the cells of the second group of cells with a second cell state after having programmed the cells of the first group of cells. The first cell state is different from the second cell state.

FIG. 1 shows the schematic layout of a magnetoresistive memory cell in an embodiment of the present invention.

The magnetoresistive memory cell 100 includes a magnetic tunnel junction (MTJ) stack 101, which includes a storage layer 103, a tunnel barrier layer 105 and a reference layer 107. The storage layer 103 and the reference layer 107 may each include a plurality of layers. For example, a respective antiferromagnetic layer (not shown) may be provided in both the storage layer and the reference layer, wherein the antiferromagnetic layer included in the storage layer has a lower blocking temperature than the antiferromagnetic layer included in the reference layer. The antiferromagnetic layers can be referred to as part of the storage layer and the reference layer, as well as the separate layers from the storage layer and the reference layer. As shown in FIG. 1, the storage layer is a free magnetic layer with switchable magnetic orientation, while the reference layer has a fixed magnetic orientation.

A bit line 109, which provides the heating current, is coupled to the MTJ stack 101 next to its storage layer 103. A field-word line 111 and a word line 113, arranged parallel to each other while perpendicular to the bit line 109, are coupled to the MTJ stack 101 next to the reference layer 107 side of the MTJ 101 without direct contact. The field-word line 111 and the word line 113 may be parallel to each other in a vertical direction as an example shown in FIG. 1, or may be parallel to each other in a horizontal direction depending on the design of the cell structure. The word line 113 is connected to the gate of a transistor 115 to activate the MTJ 101 for reading and writing operation. The drain of the transistor 115 is connected to the reference layer 107 of the MTJ through a conductive structure 117 and an interconnect layer 119. The conductive structure 117 may be a single conductive layer, or may include various vias, interconnects and additional conductive structures. The source of the transistor 115 is grounded. It is to be noted that various types of transistors may be used depending on the design of the circuit, wherein the connected component of the source, drain and gate of the transistors will be changed correspondingly.

For example in the context of thermally assisted switching of the magnetoresistive memory cell, the word line 113 is driven high to activate the MTJ stack 101, and the current provided by the bit line 109 flows through the MTJ stack 101 to the drain of the transistor 115, thereby heating the MTJ stack 101. Current with a particular direction flowing through the field-word line 111 will generate a magnetic field, which will switch the magnetic orientation of the storage layer 103, thereby programming the selected MTJ stack 101.

Figure 2:
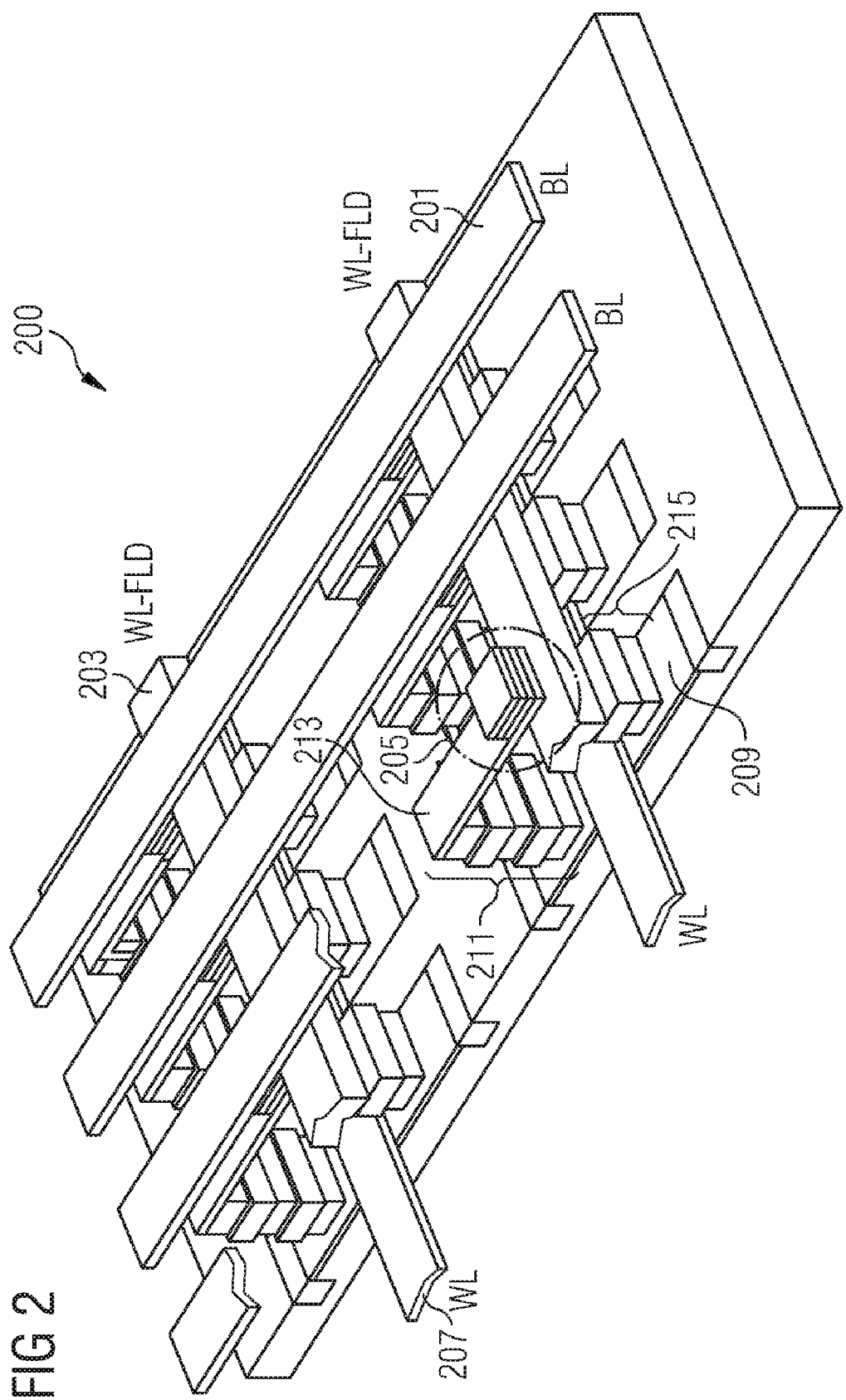
FIG. 2 shows a perspective view of a MRAM architecture having an array of memory cells.

FIG. 2 shows a perspective view of an MRAM architecture 200 in accordance with an embodiment of the invention, including an array of memory cells. The bit lines 201 and the field-word lines 203 are arranged in a matrix structure having rows and columns, with the MTJ stacks 205 being arranged at the intersection of the respective pairs of lines. The word lines 207 are arranged such that they are parallel to the field-word lines 203 and perpendicular to the bit lines 201. The word lines 207 are connected to the drain of the respective transistor 209. The drain of the respective transistor 209 is connected with a conductive structure 211, which is also in contact with an interconnect layer 213. The ground contact 215 of the transistor 209 is also shown in FIG. 2.

Figure 3:
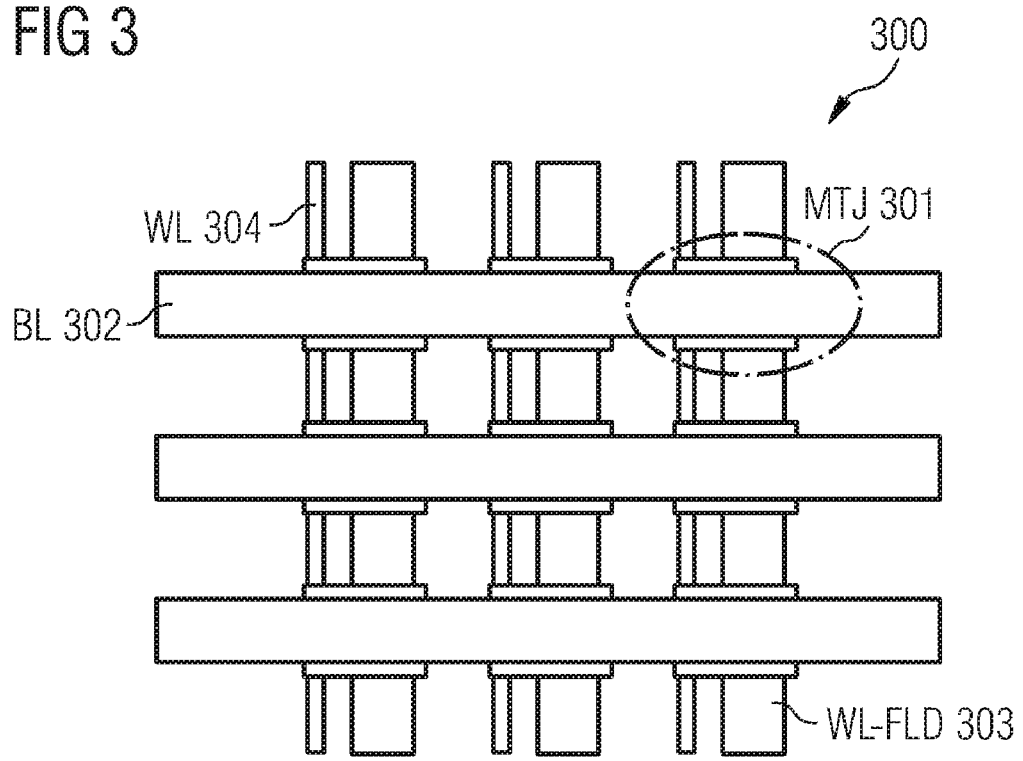
FIG. 3 shows a top view of a MRAM architecture.

FIG. 3 is a top view of an MRAM architecture 300 in accordance with an embodiment of the invention. The MTJ stacks 301 are arranged at the intersection of the bit lines 302 and field-word lines 303, with the word lines 304 extending parallel to the field-word lines 303. It is to be noted that the order of the bit lines 302, field-word lines 303 and word lines 304 may be different in different circuit designs such that e.g. the bit lines 302 are arranged below the MTJ stacks, and the word lines 304 and field-word lines 303 are arranged above the MTJ stacks.

Figure 4:
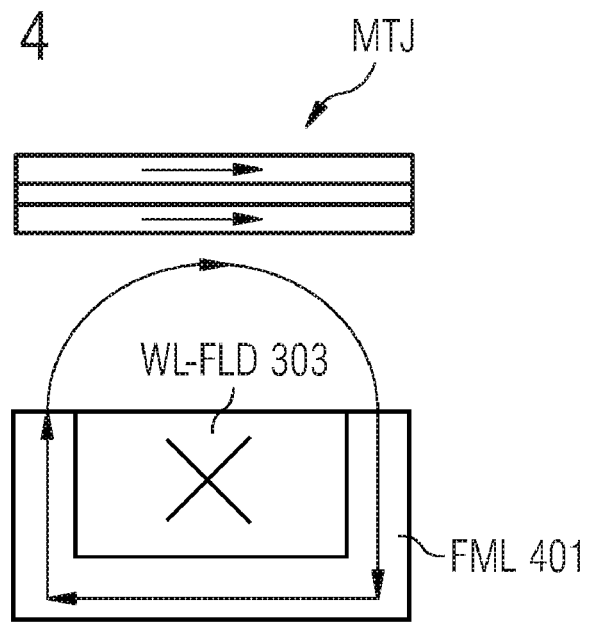
FIG. 4 shows a front view of field-word line according to one embodiment of the invention.

FIG. 4 shows a front view of the WL-FLD 303, wherein a ferromagnetic liner (FML) 401 is applied to the sides of the WL-FLD 303. The FML 401 generally serves to contain the generated magnetic field as illustrated in FIG. 4, thereby reducing unintended exposure to other non-selected memory cells. Furthermore, the FML 401 helps to reduce the requirement of the current for generating the magnetic field, thus enabling the programming of the memory cells with even lower power consumption.

A flowchart 500 of the programming of an integrated circuit having a plurality of cells according to one embodiment of the invention is shown in FIG. 5.

At 501, the plurality of cells are grouped into a first group of cells and a second group of cells depending on the cell state the cells should be programmed with. As a result, each of the first group of cells and the second group of cells includes a plurality of cells.

The cells of the first group of cells are concurrently programmed with a first cell state in 503.

After having programmed the cells of the first group of cells, the cells of the second group of cells are concurrently programmed with a second cell state in 505.

The second cell state is different from the first cell state, for example, the second cell state being the logic "1" and the first cell state being the logic "0".

FIG. 6 shows a flowchart 600 of programming a plurality of magnetoresistive memory cells according to another embodiment of the invention.

The plurality of magnetoresistive memory cells, which are connected to one common activation line, are grouped into a first group of magnetoresistive memory cells and a second group of magnetoresistive memory cells in 601, depending on the cell state the magnetoresistive memory cells should be programmed with.

For example, the magnetoresistive memory cells which should be programmed with a first logic "1" are grouped into the first group, and the magnetoresistive memory cells which should be programmed with a second logic "0" are grouped into a second group. Each of the first group and the second group includes a plurality of magnetoresistive memory cells.

In 603, at least the magnetoresistive memory cells of the first group of magnetoresistive memory cells are heated above the blocking temperature of an antiferromagnet of the respective cell. In particular, the antiferromagnet is magnetically coupled to a storage layer of the respective magnetoresistive memory cell. In other examples, all the magnetoresistive memory cells including those from the second group may be heated together.

In 605, a first magnetic field is applied to the magnetoresistive memory cells of the first group, wherein the first magnetic field is in accordance with the first cell state that is to be programmed with. Thus, the magnetoresistive memory cells of the first group of magnetoresistive memory cells are concurrently programmed with the first cell state. After having programmed the cells of the first group, the heating of the magnetoresistive memory cells of the first group is deactivated in 607, such that the programmed cell state of the cells of the first group is fixed.

Next, in 609, the magnetoresistive memory cells of the second group are heated above the blocking temperature of an antiferromagnet, which is magnetically coupled to a storage layer of the respective cell of the second group.

A second magnetic field is applied in 611 to the magnetoresistive memory cells of the second group in accordance with the second cell state, thereby concurrently programming the magnetoresistive memory cells of the second group with the second cell state.

Figure 7A:
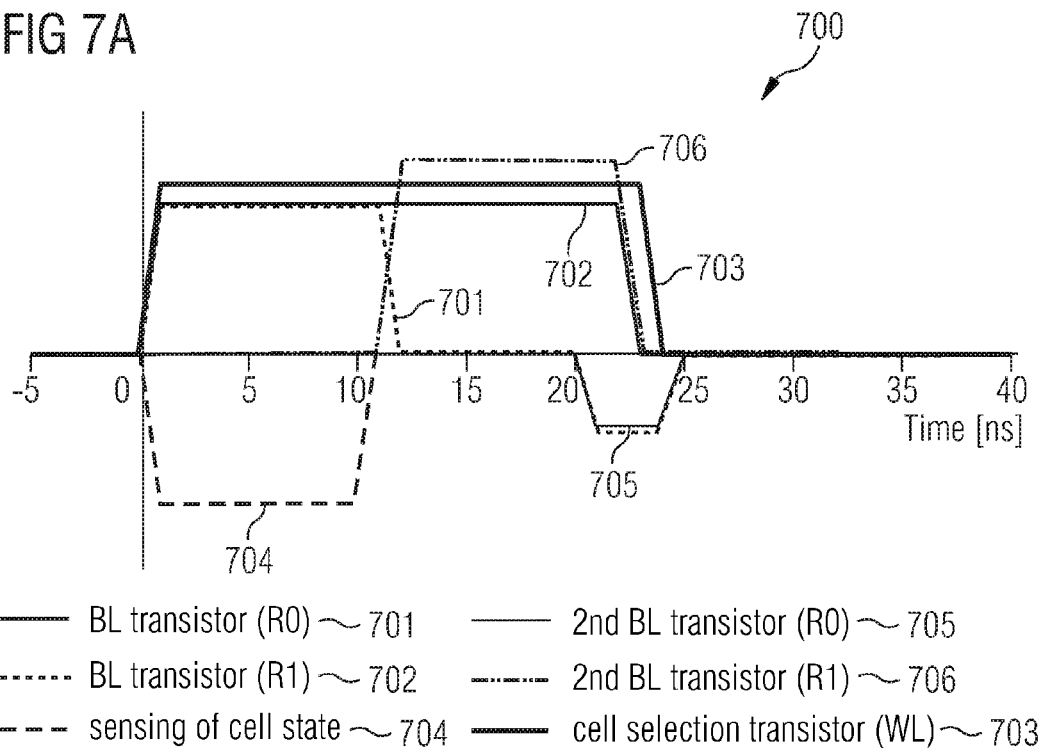
FIGS. 7A and 7B show thermal switching of the MRAM cells in the "field by BL" and "field by WL" modus, respectively.
Figure 7B:
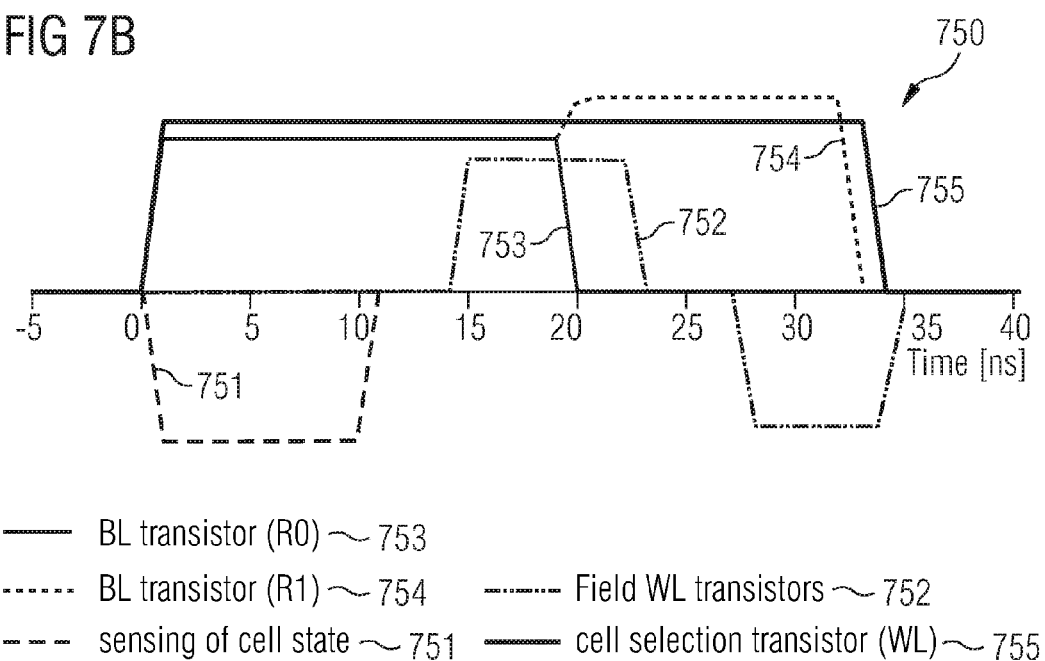

FIGS. 7A and 7B show thermal switching of the MRAM cells in the "field by BL" and "field by WL" modus, respectively.

As illustrated in a first voltage diagram 700 in FIG. 7A, BL (see first bit line transistor (which is located at a first end portion of a respective bit line) voltage curve 701 (in case that the MRAM cell is in a low resistance state) and second bit line transistor voltage curve 702 (in case that the MRAM cell is in a high resistance state) and WL (see word line transistor voltage curve 703) are turned on in the beginning for sensing of cell state (see first sensing voltage curve 704), which takes about 10 ns. Sensing the cell state is provided, since different voltages are required to heat the cell to and above the blocking temperature Tb depending on the resistance level of the cell.

If the cell is to be programmed with a logic "0" (in other words, is in a low resistance state "R0"), the first BL transistor connected to the BL stays on to heat the cell and a second BL transistor (which is located at a second end portion of a respective bit line (which is opposite to the first end of the respective bit line) is turned on (see third bit line transistor voltage curve 705) to provide the field generating pulse, such that the cell is programmed. In this case, furthermore, the second BL transistor is turned on to program the cell (see e.g. the portion of the third bit line transistor voltage curve 705 in the time period between about 20 ns and about 25 ns). After programming of the cell, the WL is turned off to deactivate the cell.

Furthermore, if the cell is programmed as logic "1" (in other words, is in a high resistance state "R1"), the first BL transistor is turned off for a while (in an embodiment of the invention, in the time period between about 12 ns to about 20 ns) after the cell state sensing has been completed (as shown in the first bit line transistor voltage curve 701) and is then turned on for programming the cell in a time period between about 20 ns and about 25 ns, for example. In this case, furthermore, the second BL transistor is turned on to heat the cell and the first BL transistor is set to provide the field generating pulse to program the cell (see e.g. fourth bit line transistor voltage curve 706). The second BL transistor is turned off shortly before the word line transistor will be turned off. After programming of the cell, the WL transistor is turned off to deactivate the cell.

In an embodiment of the invention, with the "field by BL" mode, the BL provides both the heating current and the field generating current, which renders a very simple cell layout. However, the effective write time may be about 1 ns due to rapid cooling of the cell, which requires the switching field to be well above Hc.

Furthermore, the ferromagnetic liner (FML), which helps to reduce field generating current may be difficult to make for BL. Therefore, "field by BL" mode has high power consumption, about (16×I(heat)+16×I(field)) per cycle (16 bit). Normally, I(heat) is about 0.25 mA, which is far less than I(field) which is about 2 mA. With FML, I(field) may be reduced to about 0.8 mA. The actual value may be lower than (16×I(heat)+16×I(field)) per cycle, since cells in correct state already need not be heated and switched.

FIG. 7B shows a second voltage diagram 750 illustrating the "field by WL" mode of the cell programming. BL and WL are turned on for sensing of cell state (see e.g. second sensing voltage curve 751), which takes about 10 ns. The WL-FLD transistors then pulse for +Hc for about 5 ns to about 10 ns (see e.g. a portion in a field word line voltage curve 752 between about 13 ns to about 23 ns), which programs the cell to be logic "0". If the cell is to be programmed with a logic "0" (R0), the BL transistor is turned off to stop heating (see e.g. fifth bit line voltage curve 753 at a time instant of about 20 ns). After having completed the pulse for +Hc for, the WL-FLD transistors are also turned off for about 5 ns, waiting for the programmed cells to cool down. If the respective cell is to be programmed with a logic "1", the BL transistor is ramped up such that the cell is heated (see e.g. sixth bit line voltage curve 754 at a time instant of about 20 ns). Then the WL-FLD transistors pulse for −Hc for about 5 ns to about 10 ns, which programs the cell to be logic "1" (see e.g. a portion in the field word line voltage curve 752 between about 27 ns to about 35 ns). With the "field by WL" mode, BL provides top contact for heating, while a separate WL-FLD provides the field generating current for all the cells on the same WL-FLD. This would require an additional metal level, which renders a more complex cell layout. Sensing of the cell state is provided because the field switching is done in two stages for each direction separately, which requires fast cooling rate and increases the write time by about 10 ns to about 15 ns to be about 52 ns to about 57 ns. One effect is that the power consumption can be decreased to about (16×I(heat)+2×I(field)) per cycle (16 bit). The effective write time is increased to about 5 ns and the ferromagnetic liner is easily applied to the WL-FLD, which both helps to reduce the field current requirement. During the entire time frame, the cell selection transistor of the respective word line is turned on (see e.g. word line voltage curve 755).

Referring now again to FIGS. 7A and 7B, the following tables illustrate the application of the respective voltages to the respective lines.

In the tables, the following notation will be used:

"on" represents a small current (e.g. in the range of about 0.005 mA to about 0.05 mA);

"ON" represents a medium current (e.g. in the range of about 0.05 mA to about 0.2 mA);

"ON" (in bold letters) represents a large current (e.g. in the range of about 0.2 mA to about 2 mA);

GND represents ground potential;

"off" represents a corresponding transistor being switched off.

In an embodiment of the invention, a non-field generating line is usually uni-directional line and usually only one corresponding switching transistor is provided for each line (e.g. bit line (BL) or word line (WL)). Furthermore, in an embodiment of the invention, two switching transistors are provided for each field generating line (e.g. at each corresponding end of the respective field generating line). In an embodiment of the invention, BL 1 denotes a first switching transistor being positioned at a first end of the corresponding field generating bit line and BL 2 denotes a second switching transistor being positioned at a second end (the end opposite to the first end) of the corresponding field generating bit line. In a similar manner, WL FLD 1 denotes a first switching transistor being positioned at a first end of the corresponding field generating field-word line (WL-FLD) and WL FLD 2 denotes a second switching transistor being positioned at a second end (the end opposite to the first end) of the corresponding field generating field-word line (WL-FLD).

In the following, the conventional programming will be described in more detail (it is assumed that the entire programming cycle takes 25 ns, although other programming cycles may be provided):

As will be described in more detail below, the following four cases are distinguished:

a first case, in which the memory cells are in a first logic state "0" before and after programming;

a second case, in which the memory cells are in a second logic state "1" before programming and in a first logic state "0" after programming;

a third case, in which the memory cells are in a second logic state "1" before and after programming; and a fourth case, in which the memory cells are in a first logic state "0" before programming and in a second logic state "1" after programming.

A first table illustrates the voltages/currents provided in a conventional sensing period (taking about 10 ns):

| | Cell state | | Sensing | | |
|---|---|---|---|---|---|
| | Initial | Final | BL 1 | BL 2 | WL |
| FLD by BL | 0 | 0 | on | off | on |
| | 1 | 0 | on | off | on |
| | 1 | 1 | on | off | on |
| | 0 | 1 | on | off | on |
| 25 ns | time | | 10 ns | | |

A second table illustrates the voltages/currents provided in a conventional heating period (taking about 10 ns):

| | Cell state | | Heating | | |
|---|---|---|---|---|---|
| | Initial | Final | BL 1 | BL 2 | WL |
| FLD by BL | 0 | 0 | off | off | on |
| | 1 | 0 | ON | off | on |
| | 1 | 1 | off | off | on |
| | 0 | 1 | off | ON | on |
| 25 ns | time | | 10 ns | | |

A third table illustrates the voltages/currents provided in a conventional field generating period (taking about 4 ns):

| | Cell state | | Field | | |
|---|---|---|---|---|---|
| | Initial | Final | BL 1 | BL 2 | WL |
| FLD by BL | 0 | 0 | off | off | on |
| | 1 | 0 | ON | GND | on |
| | 1 | 1 | off | off | on |
| | 0 | 1 | GND | ON | on |
| 25 ns | time | | 4 ns | | |

A fourth table illustrates the voltages/currents provided in a conventional end period (taking about 1 ns):

| | Cell state | | End | | |
|---|---|---|---|---|---|
| | Initial | Final | BL1 | BL 2 | WL |
| FLD by BL | 0 | 0 | off | off | off |
| | 1 | 0 | off | off | Off |
| | 1 | 1 | off | off | Off |
| | 0 | 1 | off | off | Off |
| 25 ns | Time | | 1 ns | | |

In the following, the programming in accordance with one embodiment of the invention will be described in more detail (it is assumed that the entire programming cycle takes 45 ns, although other programming cycles may be provided in alternative embodiments of the invention):

As will be described in more detail below, the following four cases are distinguished:

a first case, in which the memory cells are in a first logic state "0" before and after programming;

a second case, in which the memory cells are in a second logic state "1" before programming and in a first logic state "0" after programming;

a third case, in which the memory cells are in a second logic state "1" before and after programming; and a fourth case, in which the memory cells are in a first logic state "0" before programming and in a second logic state "1" after programming.

A fifth table illustrates the voltages/currents provided in a sensing period in accordance with one embodiment of the invention (taking e.g. about 10 ns):

|  | Cell state Initial | Final |  | Sensing BL | WL | WL FLD 1 | WL FLD 2 |
|---|---|---|---|---|---|---|---|
| FLD by WL | 0 | 0 | 1st group | on | on | GND | GND |
|  | 1 | 0 | 1st group | on | on | GND | GND |
|  | 1 | 1 | 2nd group | on | on | GND | GND |
|  | 0 | 1 | 2nd group | on | on | GND | GND |
| 45 ns | time |  |  | 10 ns |  |  |  |

A sixth table illustrates the voltages/currents provided in a first heating period in accordance with one embodiment of the invention (taking e.g. about 10 ns):

|  | Cell state Initial | Final |  | 1st heating BL | WL | WL FLD 1 | WL FLD 2 |
|---|---|---|---|---|---|---|---|
| FLD by WL | 0 | 0 | 1st group | off | on | GND | GND |
|  | 1 | 0 | 1st group | ON | on | GND | GND |
|  | 1 | 1 | 2nd group | off | on | GND | GND |
|  | 0 | 1 | 2nd group | off | on | GND | GND |
| 45 ns | time |  |  | 10 ns |  |  |  |

A seventh table illustrates the voltages/currents provided in a first field generating period (for programming the first logic value "0") in accordance with one embodiment of the invention (taking e.g. about 7 ns):

|  | Cell state Initial | Final |  | Field 0 BL | WL | WL FLD 1 | WL FLD 2 |
|---|---|---|---|---|---|---|---|
| FLD by WL | 0 | 0 | 1st group | Off | on | ON | GND |
|  | 1 | 0 | 1st group | ON | on | ON | GND |
|  | 1 | 1 | 2nd group | Off | on | ON | GND |
|  | 0 | 1 | 2nd group | Off | on | ON | GND |
| 45 ns | time |  |  | 7 ns |  |  |  |

An eighth table illustrates the voltages/currents provided in a second heating period in accordance with one embodiment of the invention (taking e.g. about 10 ns):

|  | Cell state Initial | Final |  | 2nd heating BL | WL | WL FLD 1 | WL FLD 2 |
|---|---|---|---|---|---|---|---|
| FLD by WL | 0 | 0 | 1st group | off | on | GND | GND |
|  | 1 | 0 | 1st group | off | on | GND | GND |
|  | 1 | 1 | 2nd group | off | on | GND | GND |
|  | 0 | 1 | 2nd group | ON | on | GND | GND |
| 45 ns | time |  |  | 10 ns |  |  |  |

A ninth table illustrates the voltages/currents provided in a second field generating period (for programming the second logic value "1") in accordance with one embodiment of the invention (taking e.g. about 7 ns):

|  | Cell state Initial | Final |  | Field 1 BL | WL | WL FLD 1 | WL FLD 2 |
|---|---|---|---|---|---|---|---|
| FLD by WL | 0 | 0 | 1st group | off | on | GND | ON |
|  | 1 | 0 | 1st group | off | on | GND | ON |
|  | 1 | 1 | 2nd group | off | on | GND | ON |
|  | 0 | 1 | 2nd group | ON | on | GND | ON |
| 45 ns | time |  |  | 7 ns |  |  |  |

A tenth table illustrates the voltages/currents provided in an end period in accordance with one embodiment of the invention (taking e.g. about 1 ns):

|  | Cell state Initial | Final |  | end BL | WL | WL FLD 1 | WL FLD 2 |
|---|---|---|---|---|---|---|---|
| FLD by WL | 0 | 0 | 1st group | off | off | GND | GND |
|  | 1 | 0 | 1st group | off | off | GND | GND |
|  | 1 | 1 | 2nd group | off | off | GND | GND |
|  | 0 | 1 | 2nd group | off | off | GND | GND |
| 45 ns | time |  |  | 1 ns |  |  |  |

In the following, the programming in accordance with one particular embodiment of the above described embodiment of the invention will be described in more detail for an eight bit cell word (Cells 1 to 8) (it is assumed that the entire programming cycle takes 45 ns, although other programming cycles may be provided in alternative embodiments of the invention):

An eleventh table illustrates the voltages/currents provided in a sensing period in accordance with one particular embodiment of the invention (taking e.g. about 10 ns):

| Example 8 bit word | Cell state Initial | Final |  | Sensing BL | WL | WL FLD 1 | WL FLD 2 |
|---|---|---|---|---|---|---|---|
| Cell 1 | 1 | 0 | 1st group | on | on | GND | GND |
| Cell 2 | 0 | 1 | 2nd group | on | on | GND | GND |
| Cell 3 | 1 | 0 | 1st group | on | on | GND | GND |
| Cell 4 | 0 | 1 | 2nd group | on | on | GND | GND |
| Cell 5 | 1 | 0 | 1st group | on | on | GND | GND |
| Cell 6 | 0 | 1 | 2nd group | on | on | GND | GND |
| Cell 7 | 1 | 0 | 1st group | on | on | GND | GND |
| Cell 8 | 0 | 1 | 2nd group | on | on | GND | GND |

A twelfth table illustrates the voltages/currents provided in a first heating period in accordance with one particular embodiment of the invention (taking e.g. about 10 ns):

| Example 8 bit word | Cell state Initial | Final | 1st heating BL | WL | WL FLD 1 | WL FLD 2 |
|---|---|---|---|---|---|---|
| Cell 1 | 1 | 0 | 1st group | ON | on | GND | GND |
| Cell 2 | 0 | 1 | 2nd group | off | on | GND | GND |
| Cell 3 | 1 | 0 | 1st group | ON | on | GND | GND |
| Cell 4 | 0 | 1 | 2nd group | off | on | GND | GND |
| Cell 5 | 1 | 0 | 1st group | ON | on | GND | GND |
| Cell 6 | 0 | 1 | 2nd group | off | on | GND | GND |
| Cell 7 | 1 | 0 | 1st group | ON | on | GND | GND |
| Cell 8 | 0 | 1 | 2nd group | off | on | GND | GND |

A thirteenth table illustrates the voltages/currents provided in a first field generating period (for programming the first logic value "0") in accordance with one particular embodiment of the invention (taking e.g. about 7 ns):

| Example 8 bit word | Cell state Initial | Final | Field 0 BL | WL | WL FLD 1 | WL FLD 2 |
|---|---|---|---|---|---|---|
| Cell 1 | 1 | 0 | 1st group | ON | on | ON | GND |
| Cell 2 | 0 | 1 | 2nd group | off | on | =cell 1 | GND |
| Cell 3 | 1 | 0 | 1st group | ON | on | =cell 1 | GND |
| Cell 4 | 0 | 1 | 2nd group | off | on | =cell 1 | GND |
| Cell 5 | 1 | 0 | 1st group | ON | on | =cell 1 | GND |
| Cell 6 | 0 | 1 | 2nd group | off | on | =cell 1 | GND |
| Cell 7 | 1 | 0 | 1st group | ON | on | =cell 1 | GND |
| Cell 8 | 0 | 1 | 2nd group | off | on | =cell 1 | GND |

An fourteenth table illustrates the voltages/currents provided in a second heating period in accordance with one particular embodiment of the invention (taking e.g. about 10 ns):

| Example 8 bit word | Cell state Initial | Final | 2nd heating BL | WL | WL FLD 1 | WL FLD 2 |
|---|---|---|---|---|---|---|
| Cell 1 | 1 | 0 | 1st group | off | on | GND | GND |
| Cell 2 | 0 | 1 | 2nd group | ON | on | GND | GND |
| Cell 3 | 1 | 0 | 1st group | off | on | GND | GND |
| Cell 4 | 0 | 1 | 2nd group | ON | on | GND | GND |
| Cell 5 | 1 | 0 | 1st group | off | on | GND | GND |
| Cell 6 | 0 | 1 | 2nd group | ON | on | GND | GND |
| Cell 7 | 1 | 0 | 1st group | off | on | GND | GND |
| Cell 8 | 0 | 1 | 2nd group | ON | on | GND | GND |

A fifteenth table illustrates the voltages/currents provided in a second field generating period (for programming the second logic value "1") in accordance with one particular embodiment of the invention (taking e.g. about 7 ns):

| Example 8 bit word | Cell state Initial | Final | Field 1 BL | WL | WL FLD 1 | WL FLD 2 |
|---|---|---|---|---|---|---|
| Cell 1 | 1 | 0 | 1st group | off | on | GND | ON |
| Cell 2 | 0 | 1 | 2nd group | ON | on | GND | =cell 1 |
| Cell 3 | 1 | 0 | 1st group | off | on | GND | =cell 1 |
| Cell 4 | 0 | 1 | 2nd group | ON | on | GND | =cell 1 |
| Cell 5 | 1 | 0 | 1st group | off | on | GND | =cell 1 |
| Cell 6 | 0 | 1 | 2nd group | ON | on | GND | =cell 1 |
| Cell 7 | 1 | 0 | 1st group | off | on | GND | =cell 1 |
| Cell 8 | 0 | 1 | 2nd group | ON | on | GND | =cell 1 |

A sixteenth table illustrates the voltages/currents provided in an end period in accordance with one particular embodiment of the invention (taking e.g. about 1 ns):

| Example 8 bit word | Cell state Initial | Final | End BL | WL | WL FLD 1 | WL FLD 2 |
|---|---|---|---|---|---|---|
| Cell 1 | 1 | 0 | 1st group | off | off | GND | GND |
| Cell 2 | 0 | 1 | 2nd group | off | off | GND | GND |
| Cell 3 | 1 | 0 | 1st group | off | off | GND | GND |
| Cell 4 | 0 | 1 | 2nd group | off | off | GND | GND |
| Cell 5 | 1 | 0 | 1st group | off | off | GND | GND |
| Cell 6 | 0 | 1 | 2nd group | off | off | GND | GND |
| Cell 7 | 1 | 0 | 1st group | off | off | GND | GND |
| Cell 8 | 0 | 1 | 2nd group | off | off | GND | GND |

Figure 8:
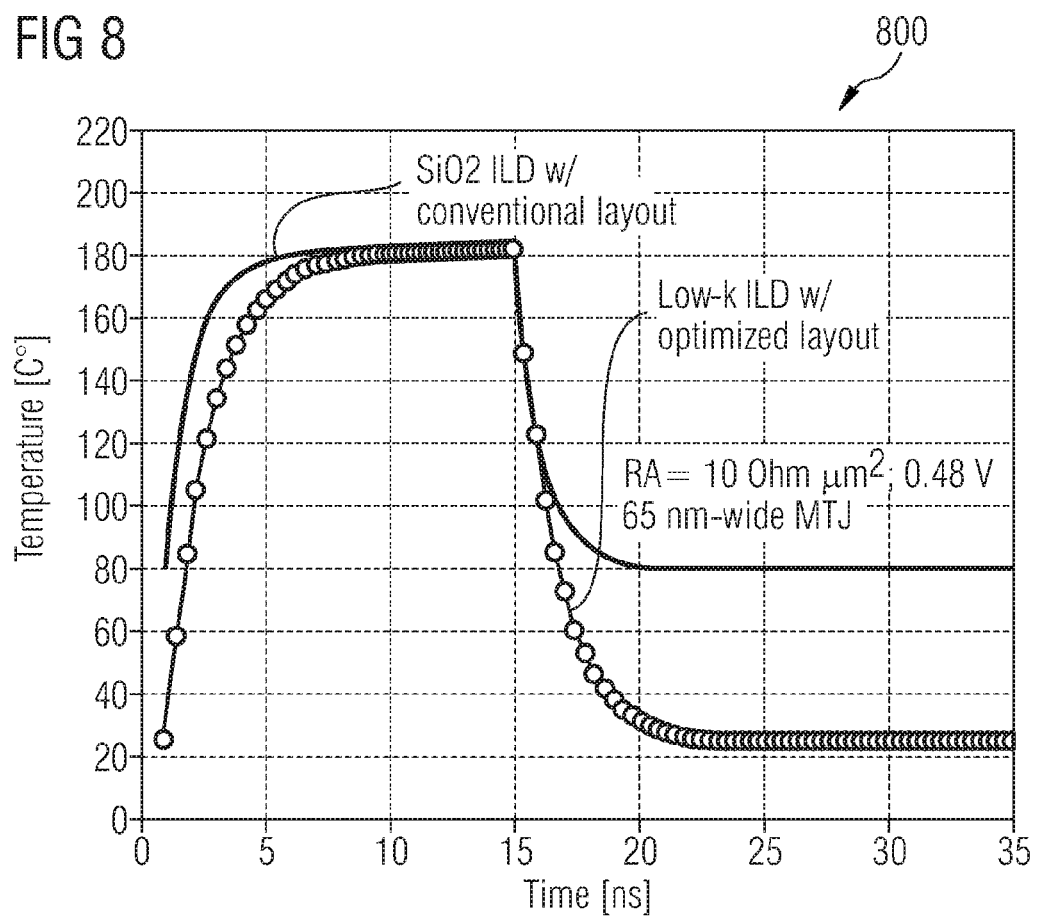
FIG. 8 shows the change of temperature for SiO2 interlevel dielectric layer with conventional layout and for low-k interlevel dielectric layer with optimized layout.

As shown in a diagram 800 in FIG. 8, a low-k interlevel dielectric layer (IDL) with optimized layout having an additional field-word line layer allows a fast cooling in about 5 ns. Normally, the cells are stable enough to withstand the magnetic field if their temperature is below 80° C. The energy needed for writing one bit is shown in Table 1, wherein "field by WL" utilizes the field-word lines with a ferromagnetic liner. As shown, the scheme of "field by WL" according to an embodiment of the present invention is more effective than the "field by BL" programming scheme. The efficiency can be further increased when the word length is large, such as 32 bits, 64 bits or 128 bits.

| Energy per bit | Cell | Cell + Transistor |
|---|---|---|
| Thermal Switching (Field by BL) | 7.0 PJ | 16 PJ |
| Thermal Switching (Field by WL) | 3.3 PJ | 9 PJ |

Figure 9:
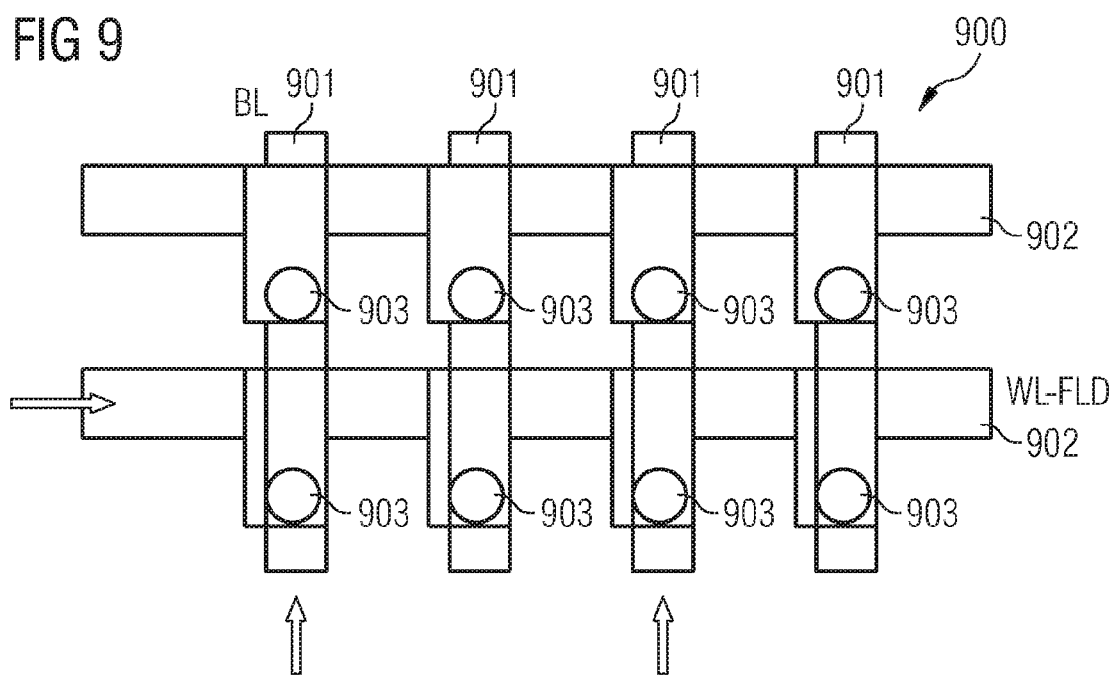
FIG. 9 shows a cell array being programmed according to the method of one embodiment of the present invention.

According to the method for programming a plurality of cells in accordance with an embodiment of the present invention, a cell array 900 being so programmed is illustrated in FIG. 9. As shown, the current through the bit lines 901 heat the cells 903 which are to be programmed, the cells being activated through the corresponding word line (not shown) which is below the field-word line 902. The current through the field-word line 902 with a specific direction programs the heated two cells correspondingly. Other cells which are not heated will not be programmed.

An integrated circuit 1000 according to one embodiment of the invention is shown in FIGS. 10A and 10B.

The integrated circuit 1000 includes a plurality of cells 1002 and a controller 1001 programming the plurality of cells 903. As shown in FIG. 10A, the controller 1001 is connected with every bit line 1003, word line 1004 and field-word line 1005, such that the current through each of these lines 1003, 1004, 1005 is controlled by the controller 1001. For example, if the controller 1001 determines to program a group of cells 1002 connected to one word line 1004, it will generate a heat control signal controlling the heating current through the bit lines 1003 corresponding to this group of cells 1002. The controller 1001 may be a microcontroller or any other programmable or non-programmable (also hard-wired logic).

An integrated circuit may also include a plurality of sub-controllers in addition to a main controller 1051, for example as shown in an integrated circuit 1050 FIG. 10B in accordance with another embodiment of the invention, e.g. a bit line sub-controller 1052, a word line sub-controller 1053 and a field-word line sub-controller 1054 such that each sub-controller 1052, 1053, 1054 controls the different group of conductive lines, respectively.

The controller 1001, 1051 is configured to group the plurality of cells 1002 of the integrated circuit 1000, 1050 into a first group of cells and a second group of cells depending on the cell state the cells 1002 should be programmed with. The controller 1001, 1051 then concurrently programs the cells 1002 of the first group of cells with a first cell state, for example, by generating control signals controlling the heating current through the selected bit lines 1003 and controlling the field generating current through the selected field-word lines 1005. After having programmed the cells 1002 of the first group of cells, the controller 1001, 1051 is further configured to concurrently program the cells 1002 of the second group of cells with a second cell state, which is different from the first cell state. The controller 1001, 1051 may be configured to implement the embodiments as explained above with regard to the programming of an integrated circuit 1000, 1050 having a plurality of cells 1002.

Figure 11A:
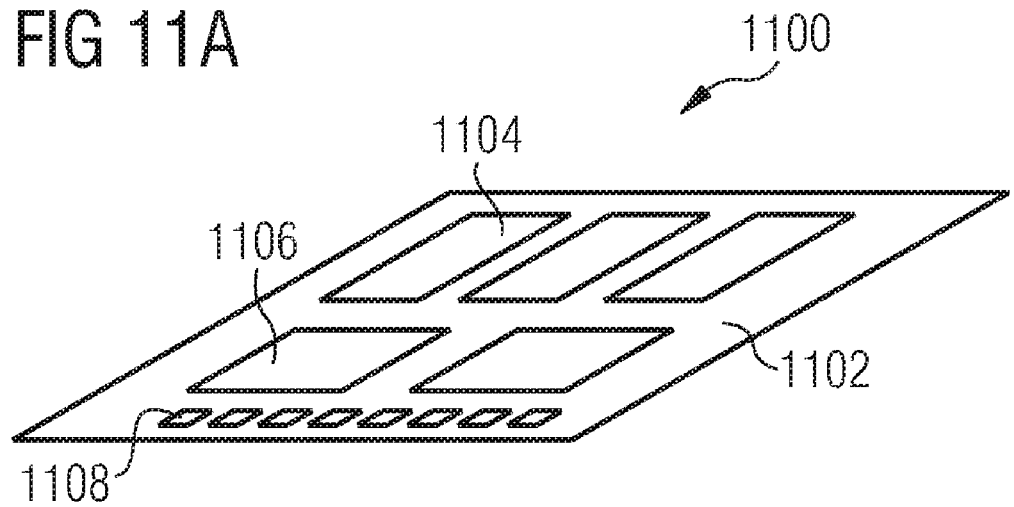
FIGS. 11A and 11B show a memory module (FIG. 11A) and a stackable memory module (FIG. 11B) in accordance with an embodiment of the invention.
Figure 11B:
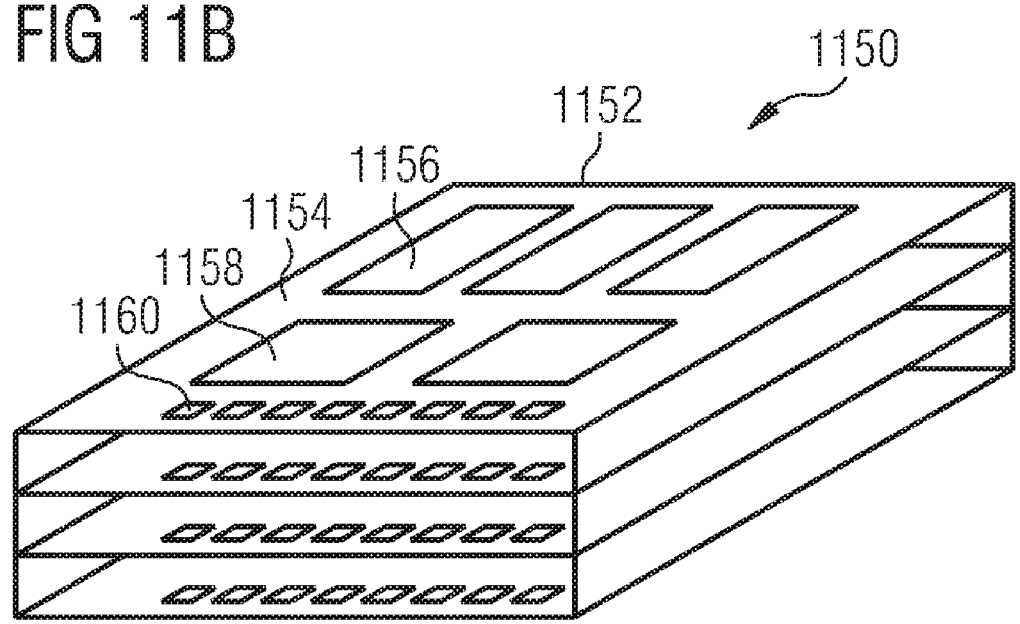

As shown in FIGS. 11A and 11B, in some embodiments, memory devices such as those described herein may be used in modules. In FIG. 11A, a memory module 1100 is shown, on which one or more memory devices 1104 are arranged on a substrate 1102. The memory device 1104 may include numerous memory cells, each of which uses a memory element in accordance with an embodiment of the invention. The memory module 1100 may also include one or more electronic devices 1106, which may include memory, processing circuitry, control circuitry, addressing circuitry, bus interconnection circuitry, or other circuitry or electronic devices that may be combined on a module with a memory device, such as the memory device 1104. Additionally, the memory module 1100 includes multiple electrical connections 1108, which may be used to connect the memory module 1100 to other electronic components, including other modules.

As shown in FIG. 11B, in some embodiments, these modules may be stackable, to form a stack 1150. For example, a stackable memory module 1152 may contain one or more memory devices 1156, arranged on a stackable substrate 1154. The memory device 1156 contains memory cells that employ memory elements in accordance with an embodiment of the invention. The stackable memory module 1152 may also include one or more electronic devices 1158, which may include memory, processing circuitry, control circuitry, addressing circuitry, bus interconnection circuitry, or other circuitry or electronic devices that may be combined on a module with a memory device, such as the memory device 1156. Electrical connections 1160 are used to connect the stackable memory module 1152 with other modules in the stack 1150, or with other electronic devices. Other modules in the stack 1150 may include additional stackable memory modules, similar to the stackable memory module 1152 described above, or other types of stackable modules, such as stackable processing modules, control modules, communication modules, or other modules containing electronic components.

In an embodiment of the invention, a method for programming an integrated circuit having a plurality of cells is provided. The method may include grouping the plurality of cells into a first group of cells and a second group of cells depending on the cell state the cells should be programmed with, the first group of cells and the second group of cells each having a plurality of cells, concurrently programming the cells of the first group of cells with a first cell state, and after having programmed the cells of the first group of cells, concurrently programming the cells of the second group of cells with a second cell state, which is different from the first cell state.

The cells may be memory cells, e.g. magnetoresistive memory cells.

In an embodiment of the invention, the method may further include determining the cell state of at least some of the cells, determining those cells, the cell state of which corresponds to the cell state the respective cell should be programmed with, and grouping the determined cells into a third group of cells.

In an embodiment of the invention, the cells of the third group of cells are not programmed.

Furthermore, the programming the magnetoresistive memory cells of the first group of magnetoresistive memory cells with the first cell state may include heating at least the magnetoresistive memory cells of the first group of magnetoresistive memory cells above the blocking temperature of an antiferromagnet being magnetically coupled to a storage layer of the respective magnetoresistive memory cell.

In an embodiment of the invention, the heating is carried out by providing electrical heating current through the magnetoresistive memory cells of the first group of magnetoresistive memory cells.

The electrical heating current may be provided to each magnetoresistive memory cell via a respective line, the respective magnetoresistive memory cell of the first group of magnetoresistive memory cells is coupled with.

In an embodiment of the invention, the programming the magnetoresistive memory cells of the first group of magnetoresistive memory cells with the first cell state may include applying a magnetic field to the magnetoresistive memory cells of the first group of magnetoresistive memory cells in accordance with the first cell state.

The magnetic field may be provided to each magnetoresistive memory cell using a magnetic field generating line.

In another embodiment of the invention, the programming the magnetoresistive memory cells of the second group of magnetoresistive memory cells with the second cell state may include heating at least the magnetoresistive memory cells of the second group of magnetoresistive memory cells above the blocking temperature of an antiferromagnet being magnetically coupled to a storage layer of the respective magnetoresistive memory cell.

The heating may be carried out by providing electrical heating current through the magnetoresistive memory cells of the second group of magnetoresistive memory cells.

The electrical heating current may be provided to each magnetoresistive memory cell via a respective line, the respective magnetoresistive memory cell of the second group of magnetoresistive memory cells is coupled with.

In yet another embodiment of the invention, the programming the cells of the first group of cells with the first cell state and the programming the cells of the second group of cells with the second cell state may include activating of cells being coupled to one common activation line.

After having programmed the magnetoresistive memory cells of the first group of magnetoresistive memory cells, the heating current through the magnetoresistive memory cells of the first group of magnetoresistive memory cells may be deactivated.

In another embodiment of the invention, a method for programming a plurality of cells is provided. The method may include grouping the plurality of cells into a first group of cells and a second group of cells depending on the cell state the cells should be programmed with, the first group of cells and the second group of cells each having a plurality of cells, concurrently programming the cells of the first group of cells with a first cell state, and after having programmed the cells of the first group of cells, concurrently programming the cells of the second group of cells with a second cell state, which is different from the first cell state.

In yet another embodiment of the invention, a method for programming a plurality of cells is provided. The method may include grouping a plurality of magnetoresistive memory cells, which are connected to one common activation line, into a first group of magnetoresistive memory cells and a second group of magnetoresistive memory cells depending on the cell state the magnetoresistive memory cells should be programmed with, the first group of magnetoresistive memory cells and the second group of magnetoresistive memory cells each having a plurality of magnetoresistive memory cells, heating at least the magnetoresistive memory cells of the first group of magnetoresistive memory cells above the blocking temperature of an antiferromagnet being magnetically coupled to a storage layer of the respective magnetoresistive memory cell and applying a first magnetic field to the magnetoresistive memory cells of the first group of magnetoresistive memory cells in accordance with the first cell state, thereby concurrently programming the magnetoresistive memory cells of the first group of magnetoresistive memory cells with the first cell state, after having programmed the cells of the first group of cells, deactivating the heating current through the magnetoresistive memory cells of the first group of magnetoresistive memory cells, and heating the magnetoresistive memory cells of the second group of magnetoresistive memory cells above the blocking temperature of an antiferromagnet being magnetically coupled to a storage layer of the respective magnetoresistive memory cell and applying a second magnetic field to the magnetoresistive memory cells of the second group of magnetoresistive memory cells in accordance with the second cell state, thereby concurrently programming the magnetoresistive memory cells of the second group of magnetoresistive memory cells with the second cell state.

In an embodiment of the invention, an integrated circuit is provided, which may include a plurality of cells, a controller programming the plurality of cells, wherein the controller is configured to group a plurality of cells into a first group of cells and a second group of cells depending on the cell state the cells should be programmed with, the first group of cells and the second group of cells each having a plurality of cells, to concurrently program the cells of the first group of cells with a first cell state, and after having programmed the cells of the first group of cells, to concurrently program the cells of the second group of cells with a second cell state, which is different from the first cell state.

The cells may be memory cells, e.g. magnetoresistive memory cells.

In an embodiment of the invention, the controller is further configured to determine the cell state of at least some of the cells, determine those cells, the cell state of which corresponds to the cell state the respective cell should be programmed with, and group the determined cells into a third group of cells.

The controller may further be configured to not program the cells of the third group of cells.

In an embodiment of the invention, the controller is further configured to, when programming the magnetoresistive memory cells of the first group of magnetoresistive memory cells with the first cell state, generate a heat control signal controlling heating at least the magnetoresistive memory cells of the first group of magnetoresistive memory cells above the blocking temperature of an antiferromagnet being magnetically coupled to a storage layer of the respective magnetoresistive memory cell.

The controller may further be configured to control the heating by controlling electrical heating current flowing through the magnetoresistive memory cells of the first group of magnetoresistive memory cells.

In an embodiment of the invention, the integrated circuit further may include a plurality of heating lines, each cell being coupled with one heating line of the plurality of heating lines.

In an embodiment of the invention, the integrated circuit further may include a magnetic field generating line generating a magnetic field programming the plurality of cells.

In an embodiment of the invention, the integrated circuit further may include a common activation line, at least some of the cells being coupled with the common activation line.

In yet another embodiment of the invention, the controller may further be configured to, after having programmed the magnetoresistive memory cells of the first group of magnetoresistive memory cells, deactivate the heating current through the magnetoresistive memory cells of the first group of magnetoresistive memory cells.

In another embodiment of the invention, a cell arrangement is provided. The cell arrangement may include a plurality of magnetoresistive memory cells, a controller programming the plurality of cells, wherein the controller is configured to group a plurality of magnetoresistive memory cells, which are connected to one common activation line, into a first group of magnetoresistive memory cells and a second group of magnetoresistive memory cells depending on the cell state the magnetoresistive memory cells should be programmed with, the first group of magnetoresistive memory cells and the second group of magnetoresistive memory cells each having a plurality of magnetoresistive memory cells, to heat at least the magnetoresistive memory cells of the first group of magnetoresistive memory cells above the blocking temperature of an antiferromagnet being magnetically coupled to a storage layer of the respective magnetoresistive memory cell and to apply a first magnetic field to the magnetoresistive memory cells of the first group of magnetoresistive memory cells in accordance with the first cell state, thereby concurrently programming the magnetoresistive memory cells of the first group of magnetoresistive memory cells with the first cell state, after having programmed the cells of the first group of cells, to deactivate the heating current through the magnetoresistive memory cells of the first group of magnetoresistive memory cells, and heat the magnetoresistive memory cells of the second group of magnetoresistive memory cells above the blocking temperature of an antiferromagnet being magnetically coupled to a storage layer of the respective magnetoresistive memory cell and to apply a second magnetic field to the magnetoresistive memory cells of the second group of magnetoresistive memory cells in accordance with the second cell state, thereby concurrently programming the magnetoresistive memory cells of the second group of magnetoresistive memory cells with the second cell state.

In an embodiment of the invention, an integrated circuit means is provided, which may include a plurality of cell means, a control means for programming the plurality of cell means, wherein the control means is configured to group a plurality of cells into a first group of cells and a second group of cells depending on the cell state the cells should be programmed with, the first group of cells and the second group of cells each having a plurality of cells, to concurrently program the cells of the first group of cells with a first cell state, and after having programmed the cells of the first group of cells, to concurrently program the cells of the second group of cells with a second cell state, which is different from the first cell state.

In yet another embodiment of the invention, a memory module is provided, which may include a plurality of integrated circuits, wherein at least one integrated circuit of the plurality of integrated circuits may include a plurality of cells and a controller programming the plurality of cells, wherein the controller may be configured to group a plurality of cells into a first group of cells and a second group of cells depending on the cell state the cells should be programmed with, the first group of cells and the second group of cells each having a plurality of cells, to concurrently program the cells of the first group of cells with a first cell state, and after having programmed the cells of the first group of cells, to concurrently program the cells of the second group of cells with a second cell state, which is different from the first cell state.

The memory module may be a stackable memory module in which at least some of the integrated circuits are stacked one above the other.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for programming an integrated circuit having a plurality of cells, the method comprising:
   grouping the plurality of cells into a first group of cells and a second group of cells depending on a cell state the cells should be programmed with, the first group of cells and the second group of cells each having a plurality of cells;
   concurrently programming the cells of the first group of cells with a first cell state; and
   after having programmed the cells of the first group of cells, concurrently programming the cells of the second group of cells with a second cell state, the second cell state being different from the first cell state.

2. The method of claim 1, wherein the cells are memory cells.

3. The method of claim 2, wherein the memory cells are magnetoresistive memory cells.

4. The method of claim 1, further comprising:
   determining the cell state of at least some of the cells;
   determining those cells, the cell state of which corresponds to the cell state the respective cell should be programmed with; and
   grouping the determined cells into a third group of cells.

5. The method of claim 4, wherein the cells of the third group of cells are not programmed.

6. The method of claim 3, wherein programming the magnetoresistive memory cells of a first group of magnetoresistive memory cells with the first cell state comprises heating at least the magnetoresistive memory cells of the first group of magnetoresistive memory cells above a blocking temperature of an antiferromagnet being magnetically coupled to a storage layer of the respective magnetoresistive memory cell.

7. The method of claim 6, wherein the heating is carried out by providing electrical heating current through the magnetoresistive memory cells of the first group of magnetoresistive memory cells.

8. The method of claim 7, wherein the electrical heating current is provided to each magnetoresistive memory cell via a respective line, the respective magnetoresistive memory cell of the first group of magnetoresistive memory cells is coupled with.

9. The method of claim 3, wherein programming the magnetoresistive memory cells of the first group of magnetoresistive memory cells with the first cell state comprises applying a magnetic field to the magnetoresistive memory cells of the first group of magnetoresistive memory cells in accordance with the first cell state.

10. The method of claim 9, wherein the magnetic field is provided to each magnetoresistive memory cell using a magnetic field generating line.

11. The method of claim 6, wherein programming the magnetoresistive memory cells of a second group of magnetoresistive memory cells with the second cell state comprises heating at least the magnetoresistive memory cells of the second group of magnetoresistive memory cells above the blocking temperature of an antiferromagnet being magnetically coupled to a storage layer of the respective magnetoresistive memory cell.

12. The method of claim 11, wherein the heating is carried out by providing electrical heating current through the magnetoresistive memory cells of the second group of magnetoresistive memory cells.

13. A method for programming a plurality of cells, the method comprising:
   grouping the plurality of cells into a first group of cells and a second group of cells depending on a cell state the cells should be programmed with, the first group of cells and the second group of cells each having a plurality of cells;
   concurrently programming the cells of the first group of cells with a first cell state; and
   after having programmed the cells of the first group of cells, concurrently programming the cells of the second group of cells with a second cell state, which is different from the first cell state.

14. An integrated circuit comprising:
   a plurality of cells;
   a controller programming the plurality of cells, wherein the controller is configured to:
      group the plurality of cells into a first group of cells and a second group of cells depending on a cell state the cells should be programmed with, the first group of cells and the second group of cells each having a plurality of cells;
      cause the cells of the first group of cells to be concurrently programmed with a first cell state; and
      after the cells of the first group of cells are programmed, cause the cells of the second group of cells to be concurrently programmed with a second cell state, which is different from the first cell state.

15. The integrated circuit of claim 14, wherein the cells are memory cells.

16. The integrated circuit of claim 15, wherein the memory cells are magnetoresistive memory cells.

17. The integrated circuit of claim 14, wherein the controller is further configured to:
   determine the cell state of at least some of the cells;
   determine those cells, the cell state of which corresponds to the cell state the respective cell should be programmed with; and
   group the determined cells into a third group of cells.

18. The integrated circuit of claim 17, wherein the controller is further configured to not program the cells of the third group of cells.

19. The integrated circuit of claim 16, wherein the controller is further configured when programming the magnetoresistive memory cells of the first group of magnetoresistive memory cells with the first cell state to generate a heat control signal controlling heating at least the magnetoresistive memory cells of the first group of magnetoresistive memory cells above the blocking temperature of an antiferromagnet being magnetically coupled to a storage layer of the respective magnetoresistive memory cell.

20. The integrated circuit of claim 19, wherein the controller is further configured to control the heating by controlling electrical heating current flowing through the magnetoresistive memory cells of the first group of magnetoresistive memory cells.

21. The integrated circuit of claim 14, further comprising a plurality of heating lines, each cell being coupled with one heating line of the plurality of heating lines.

22. The integrated circuit of claim 14, further comprising a magnetic field generating line generating a magnetic field programming the plurality of cells.

23. The integrated circuit of claim 14, further comprising a common activation line, at least some of the cells being coupled with the common activation line.

24. A memory module, comprising:
   a plurality of integrated circuits, wherein at least one integrated circuit of the plurality of integrated circuits comprises a plurality of cells and a controller programming the plurality of cells, wherein the controller is configured to:
      group the plurality of cells into a first group of cells and a second group of cells depending on a cell state the cells should be programmed with, the first group of cells and the second group of cells each having a plurality of cells;
      cause the cells of the first group of cells to be concurrently programmed with a first cell state; and
      after having programmed the cells of the first group of cells, cause the cells of the second group of cells to be concurrently programmed with a second cell state, the second cell state being different from the first cell state.

* * * * *